US 11,482,435 B2

(12) United States Patent
Kawakami et al.

(10) Patent No.: US 11,482,435 B2
(45) Date of Patent: Oct. 25, 2022

(54) PLASMA PROCESSING APPARATUS

(71) Applicant: HITACHI HIGH-TECH CORPORATION, Tokyo (JP)

(72) Inventors: Masatoshi Kawakami, Tokyo (JP); Tsutomu Nakamura, Tokyo (JP); Hideki Kihara, Tokyo (JP); Hiroho Kitada, Tokyo (JP); Hidenobu Tanimura, Tokyo (JP); Hironori Kusumoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 395 days.

(21) Appl. No.: 16/563,075

(22) Filed: Sep. 6, 2019

(65) Prior Publication Data

US 2019/0393058 A1  Dec. 26, 2019

Related U.S. Application Data

(63) Continuation of application No. 14/463,756, filed on Aug. 20, 2014, now abandoned.

(30) Foreign Application Priority Data

Jan. 28, 2014  (JP) ................. 2014-012917

(51) Int. Cl.
*H01L 21/67* (2006.01)
*G01J 5/08* (2022.01)
*H01J 37/32* (2006.01)
*G01J 5/0875* (2022.01)

(52) U.S. Cl.
CPC ...... *H01L 21/67248* (2013.01); *G01J 5/0875* (2013.01); *H01J 37/32192* (2013.01); *H01J 37/32522* (2013.01); *H01J 37/32807* (2013.01); *H01J 37/32935* (2013.01)

(58) Field of Classification Search
None
See application file for complete search history.

(56) References Cited

U.S. PATENT DOCUMENTS

| 5,851,842 | A  | 12/1998 | Katsumata et al. |
| 5,897,378 | A  | 4/1999  | Eriguchi |
| 6,071,375 | A  | 6/2000  | Chen et al. |
| 6,235,119 | B1 | 5/2001  | Yang |

(Continued)

FOREIGN PATENT DOCUMENTS

JP  H08250293 A  9/1996

OTHER PUBLICATIONS

Final Office Action dated Oct. 4, 2019 in U.S. Appl. No. 14/463,756.

*Primary Examiner* — Jeffrie R Lund
*Assistant Examiner* — Tiffany Z Nuckols
(74) *Attorney, Agent, or Firm* — Miles & Stockbridge, P.C.

(57) ABSTRACT

In a plasma processing apparatus, an additional viewing window is disposed between an infrared temperature sensor and a view window, and the additional viewing window is cooled to be retained at room temperature (20° C. to 25° C.), to reduce and to stabilize electromagnetic waves emitted from the viewing window. By correcting the value of the electromagnetic waves, the measurement precision of the temperature monitor is increased and it is possible to measure and to control the dielectric window temperature in a stable state.

6 Claims, 7 Drawing Sheets

(56) References Cited

U.S. PATENT DOCUMENTS

| | | |
|---|---|---|
| 6,306,246 B1 | 10/2001 | Melvin et al. |
| 6,503,364 B1 | 1/2003 | Masuda et al. |
| 7,833,381 B2 | 11/2010 | Johnson |
| 2005/0127192 A1 | 6/2005 | Kang et al. |
| 2007/0076780 A1 | 4/2007 | Champetier |
| 2011/0312107 A1 | 12/2011 | Yves |
| 2012/0192953 A1* | 8/2012 | Matsushima ..... H01J 37/32449 137/1 |

* cited by examiner

PLASMA PROCESSING APPARATUS

BACKGROUND OF THE INVENTION

The present invention relates to a plasma processing apparatus for processing a sample such as a semiconductor wafer placed in a processing chamber in a vacuum container, by use of plasma formed in the processing chamber, and in particular, to a plasma processing apparatus for processing a sample while adjusting temperature of a member configuring a wall of the processing chamber.

Due to the recent development of finer semiconductor devices, in an etching process to copy, onto a lower layer, a mask formed by lithography, there is required high dimensional precision, namely, precision of Critical Dimension (CD). In the mass-production of such semiconductor devices, it is important to secure reproducibility of CD in addition to high CD controllability.

In general, the critical dimension deviates in the etching process due to factors such as adhesion of byproducts from materials to be processed, onto inner walls of the etching chamber, wear of inner members of the chamber due to long-period use thereof, and variation in the plasma state affecting etching performance due to change in the adhesion probability of radicals onto inner walls or the like of the chamber caused by variation in temperature or the like of inner members of the chamber.

In some plasma processing apparatuses heat of the prior art, to suppress variation in inner temperature of the chamber, outer walls of the vacuum chamber are heated by use of a conversion heater. Further, in some other plasma processing apparatuses of the conventional technique, window members or the like made of dielectrics arranged in waveguide paths of an electric field and a magnetic field wherein it is to be avoided to dispose any items which adversely affect propagation of electric and magnetic fields such as microwaves to generate plasma, are heated by blowing a warm wind thereto.

According to the techniques, in order to adjust temperature with high precision, it is required that temperature of the target of temperature adjustment is detected to adjust the quantity of heat of the heater and the temperature of the warm wind based on the results of detection. However, it is desired to avoid installation of a contact-type thermometer which disturbs the electric or magnetic field as above. Hence, there has been employed an apparatus to detect temperature in a contactless manner, for example, a radiation thermometer. Further, when detecting temperature by the radiation thermometer, a viewing window is disposed between the thermometer and a target of temperature detection such as a window member to face the target (or to overlook the target), the viewing window passing therethrough infrared rays emitted from the target.

JP-A-8-250293 describes a technique in which a dielectric material such as alumina is used to form members configuring inner wall surfaces of the vacuum chamber or to form surfaces of the wall surface members, and a window made of quartz is disposed to face the processing chamber; and temperature of the inner wall surface members is detected by an infrared thermometer via the window to control the temperature of plasma-tolerant walls with high precision, to thereby stabilize the processing which is conducted by use of plasma.

SUMMARY OF THE INVENTION

The conventional techniques are accompanied with a problem since consideration has not been fully given to the following point. Specifically, in the conventional techniques employing an apparatus such as the radiation thermometer to detect temperature in a contactless manner by use of electromagnetic waves in a band of a particular wavelength, consideration has not been given to influence of electromagnetic waves emitted from the viewing window itself.

When the viewing window receives heat through radiation or conduction to be heated and temperature thereof goes up, members of the viewing window emit electromagnetic waves such as infrared rays and far-infrared rays. Hence, the thermometer to detect temperature by receiving electromagnetic waves through the viewing window naturally receives electromagnetic waves passing through the viewing window and electromagnetic waves emitted from the viewing window. As a result, the thermometer detect the temperature based on the quantity of electromagnetic waves different from that of electromagnetic waves corresponding the actual temperature of the member as the target of temperature detection, deteriorating the detection precision. This point has not been taken into consideration in the conventional techniques.

It is therefore an object of the present invention to provide a plasma processing apparatus in which temperature of members configuring a target device is detected with higher precision to more stably adjust the temperature, to thereby increasing stability of plasma processing.

To achieve the object according to the present invention, there is provided a plasma processing apparatus comprising:

a processing chamber which is connected to a vacuum pumping apparatus and an inside of which can be decompressed, the processing chamber being sealed by a dielectric window and a vacuum container;

a gas supply apparatus for supplying gas in the processing chamber;

a substrate electrode on which a member to be processed can be mounted and temperature of which can be controlled by a temperature controller;

high-frequency wave supply means for supplying, via the dielectric window, electromagnetic waves to generate plasma;

means for forming a magnetic field to generate the plasma;

a high-frequency power supply connected to the high-frequency wave supply means;

an infrared radiation temperature sensor for monitoring temperature of the dielectric window;

a warm-wind heater for supplying a warm wind to the dielectric window;

a function to adjust the temperature of the dielectric window based on a signal measured by the infrared radiation temperature sensor, the plasma processing apparatus further comprising, in order that the infrared radiation temperature sensor is installed at a position where magnetic flux density is equal to or less than one tenth of magnetic flux density in a coil:

a metallic mesh disposed on an upper surface of a cavity resonator for preventing leakage of a microwave;

a viewing window for passing an infrared ray therethrough;

a perpendicular viewing hole disposed in a waveguide for viewing an inside of the viewing window by the infrared radiation temperature sensor; and a support stage for supporting the infrared radiation temperature sensor from the waveguide to provide a distance from the coil, wherein an additional viewing window is arranged between the infrared radiation temperature sensor and the viewing window, the additional viewing window is cooled to be retained at a room temperature (20° C. to 25° C.) to reduce and to stabilize an electromagnetic wave emitted from the additional window itself, a value of the electromagnetic wave is corrected to increase measuring precision of a temperature monitor, to measure and to control the temperature of the dielectric window in a stable state.

According to the present invention, there is obtained an advantage in which electromagnetic waves emitted from the viewing window are reduced and are stabilized, and the value thereof is corrected, to thereby increase measuring precision of the temperature monitor.

DESCRIPTION OF THE EMBODIMENTS

Figure 1:
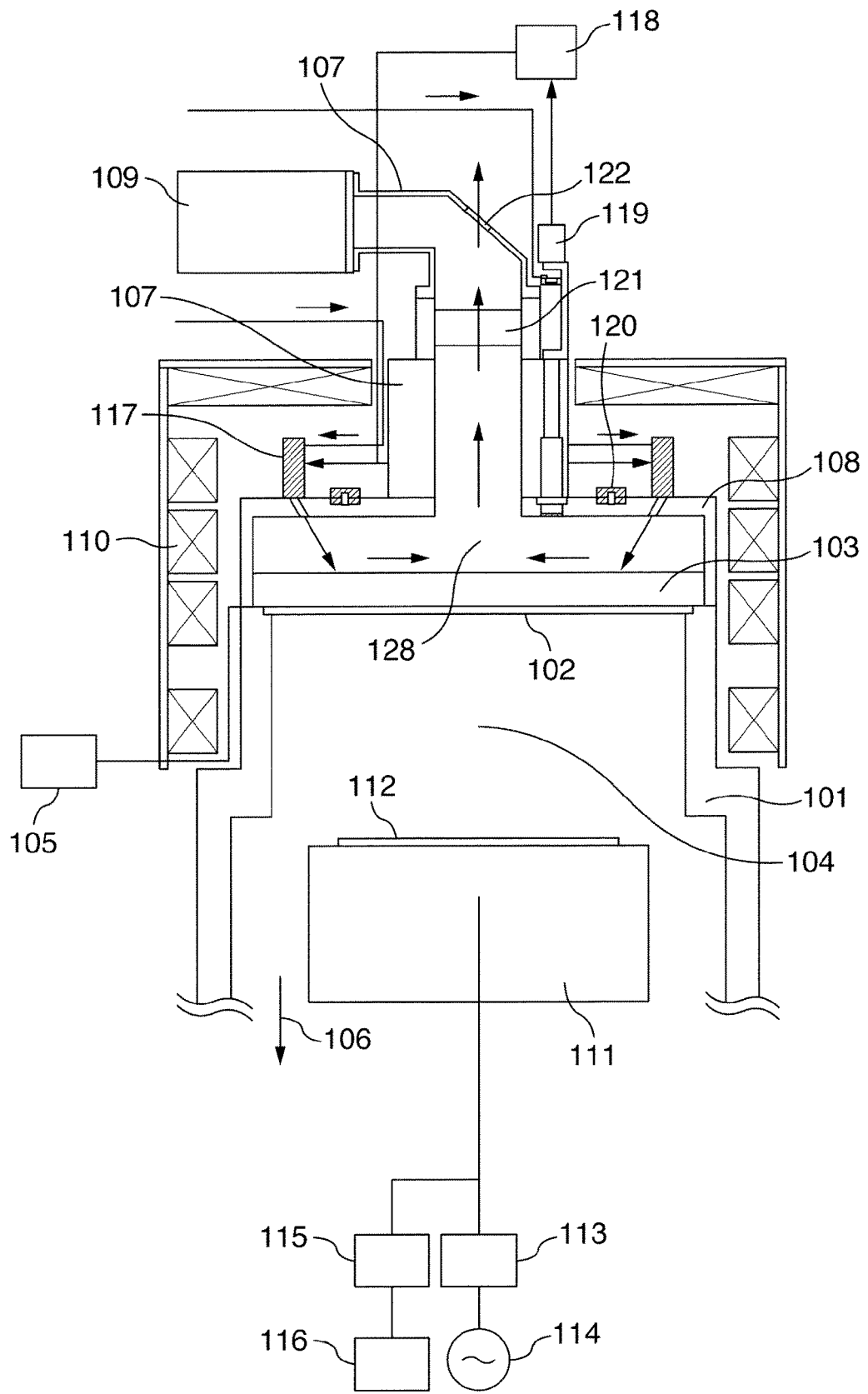
FIG. 1 is a longitudinal cross-sectional view showing an outline of a configuration of a plasma processing apparatus according to an embodiment of the present invention.

Next, description will be given of an embodiment of the present invention by referring to the drawings.

Embodiment 1

Figure 2:
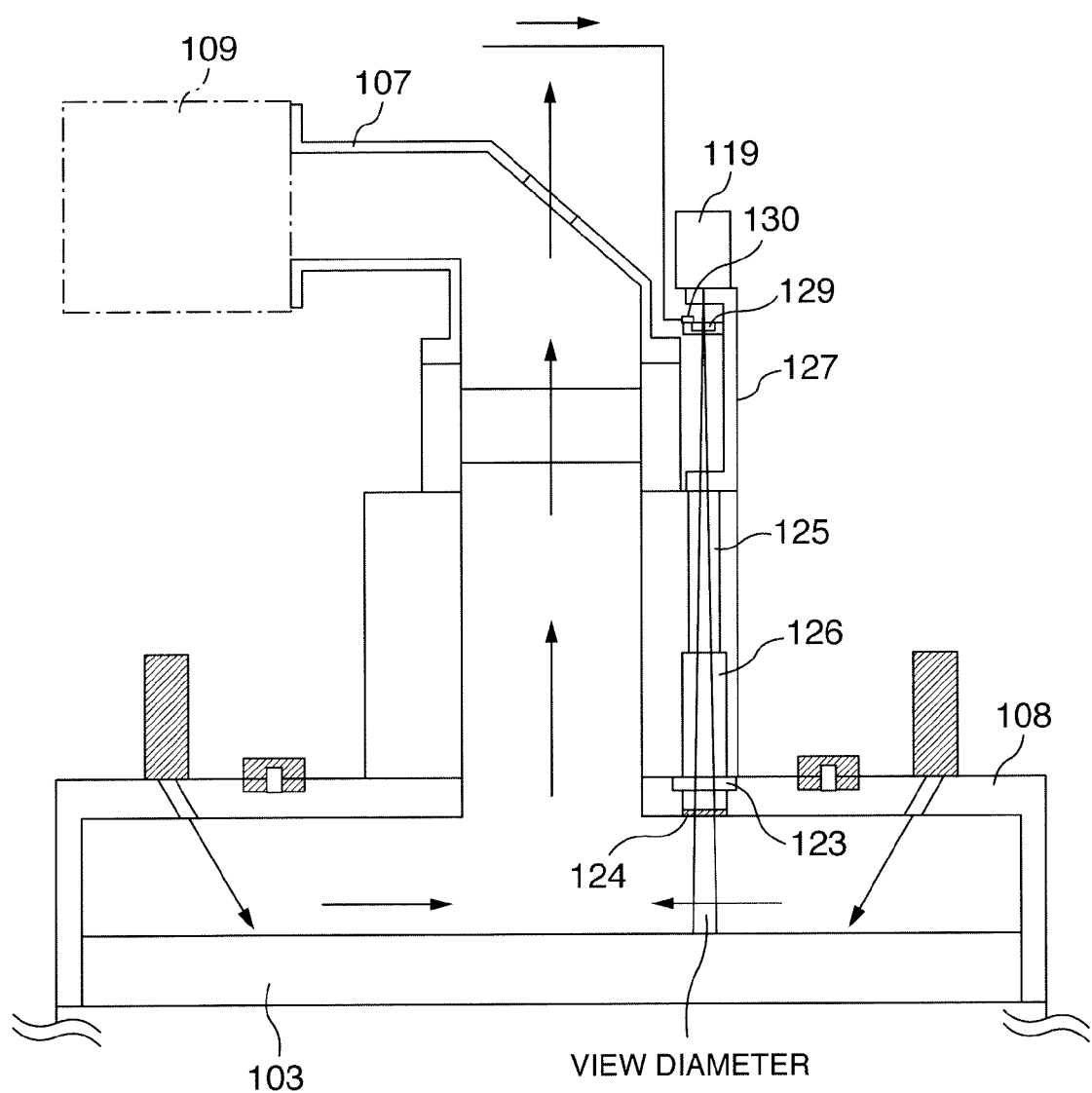
FIG. 2 is a longitudinal cross-sectional view showing a magnified image of an upper section of the plasma processing apparatus shown in FIG. 1.

Referring now to the drawings, description will be given of an embodiment of the present invention. FIGS. 1 and 2 show a plasma processing apparatus according to an embodiment of the present invention. Particularly, in this embodiment, the apparatus is a plasma processing apparatus to conduct microwave Electron Cyclotron Resonance (ECR) etching.

FIG. 1 shows, in a longitudinal cross-sectional view, an outline of a configuration of the plasma processing apparatus according to an embodiment of the present invention. In FIG. 1, the plasma processing apparatus has a cylindrical contour or a contour to be regarded as a cylindrical contour. On an upper section of a cylindrical sidewall of a vacuum container 101 is open. Over the upper section, a disk-contour dielectric window 103 made of, for example, quartz is installed. By sealing the gap between the vacuum container 101 and the dielectric window 103, the inside thereof is sealed up to an airtight state.

Below the dielectric window 103, there is disposed a shower plate 102 made of, for example, quartz or yttria in which a plurality of through holes are arranged to feed etching gas into the processing chamber 104 in the vacuum container 101. The processing chamber 104 is configured in a state in which the ceiling surface thereof is sealed up in an airtight state between the dielectric window 103 and the sidewall of the vacuum container 101. The bottom surface of the processing chamber 104 is configured using the shower plate 102, which faces plasma formed in the processing chamber 104. During the etching process, heat is imparted from the plasma via the shower plate 102 to the dielectric window 103 arranged thereover.

Between the shower plate 102 and the dielectric window 103, a space is formed as shown in FIG. 1. The space is communicatively connected to a gas supply 105 to flow etching gas. Etching gas fed from the gas supply 105 diffuses in the space and is then delivered via the through holes of the shower plate 102 to the processing chamber 104 Below the vacuum container 101, a vacuum pumping apparatus, not shown, is disposed to be communicatively connected to the processing chamber 104 via a vacuum pumping hole 106 disposed in the bottom surface of the processing chamber 104 in the vacuum container 101.

To supply the processing chamber 104 with power to generate plasma, a waveguide or an antenna 107 is disposed as a high frequency emitting apparatus above the dielectric window 103 to emit electromagnetic waves. The waveguide 107 includes a cylindrical tube-shaped section extending upward above the dielectric window 103. In the tube-shaped section, a dielectric plate 121 made of, for example, quartz is arranged to adjust the distribution of electromagnetic waves in the processing chamber 104 below the dielectric window 103.

The cylindrical tube-shaped section extending in the longitudinal direction of waveguide 107 includes an upper end section which is connected to one end section of a horizontally extending tube-shaped section having a rectangular cross section, and is resultantly changed in the extending direction. On the other end side of the tube-shaped section having a rectangular cross section, a power supply 109 is disposed to generate electromagnetic waves to be transmitted to the inside of the waveguide 107. The frequency of the electromagnetic waves is not particularly limited, but a 2.45 GHz microwave is employed in the present embodiment.

In the outer circumferential section of the processing chamber 104 above the dielectric window 103 and on the outer circumferential side of the sidewall of the cylindrical section of the vacuum container 101, a magnetic field generating coil 110 is arranged to form a magnetic field. An electric field which is generated from the electromagnetic wave generating power supply 109 and which is fed via the waveguide 107, the dielectric window 103, and the shower plate 102 to the processing chamber 104 reacts with a magnetic field which is generated by the magnetic field generating coil 110 when a direct current is supplied. The reaction excites particles of the etching gas to form plasma in a space below the shower plate 102 in the processing chamber 104. According to the present embodiment, in the lower section of the processing chamber 104 and below the shower plate 102, a sample stage having an electrode therein 111 is disposed to face the bottom surface of the shower plate 102.

In the present embodiment, the sample stage 111 is configured in a substantially 1.5 cylindrical contour and includes an upper surface on which a wafer 112 to be processed is to be mounted. On the upper surface, a film made of dielectric, not shown, formed by spraying is disposed. In the dielectric film, at least one film-shaped electrode is arranged and is connected via a high-frequency filter 115 to a direct-current (dc) power supply 116 to supply dc power to the electrode. In the sample stage 111, a disk-shaped substrate made of a conductor is disposed and is connected via a matching circuit 113 to a high-frequency power supply 114.

In such plasma processing apparatus, a vacuum container 101 is coupled to a sidewall of a second vacuum container 101, not shown; in the vacuum container 101, a vacuum transfer chamber in which transfer devices such as a robot arm are disposed in a decompressed transfer chamber. A wafer 112 transferred through the transfer chamber into the processing chamber 104 is electrostatically chucked onto the sample stage 111 by electrostatic force of the dc voltage applied from the dc power supply 116. A predetermined etching gas is then supplied from the gas supply 105 to the processing chamber 104 and the internal pressure of the processing chamber 104 is adjusted to the pressure suitable for the processing. Thereafter, the electric field and the magnetic field are formed in the processing chamber 104, to generate plasma in a space between the sample stage 111 and the shower plate 102 in the processing chamber 104. In the state in which the plasma is generated, high-frequency power is applied from the high-frequency power supply 114 connected to the sample stage 111, to form bias potential above the wafer 112. Hence, charged particles in the plasma are drawn onto the surface of the wafer 112, to thereby etch a target film disposed on the surface of the wafer 112.

During the etching process, to control temperature of the dielectric window 103 and the shower plate 102, a warm-wind heater 117 is disposed as a heater for the dielectric window 103 and the shower plate 102. Specifically, in the member configuring the ceiling surface corresponding to the upper surface of the cylinder of a cavity resonator 108 which is disposed above the dielectric window 103 and between the dielectric window 103 and the waveguide 107 and which has a cylindrical space therein, there is disposed the heater 117 which is connected to a gas line to pass therethrough dry air at the room temperature and which heats up the dry air supplied thereto, to a desired temperature to supply the heated dry air to a cylindrical sealed space 128, to thereby heat the dielectric window 103 and the shower plate 102. Further, the heater 117 is connected to a warm-wind heater controller 118.

The dry air heated by the heater 117 is fed into the waveguide via a gas supply hole disposed in the member configuring the ceiling surface of the cavity resonator 108. The dry air makes contact with the dielectric window 103 to impart heat thereto, and the dielectric window 103 is hence heated. Though heat conduction, the shower plate 102 disposed therebelow is also heated.

In the ceiling surface of the cavity resonator 108, there is disposed a ring-shaped member having a ring-shaped groove to configure a cooling water path 120 through which water flows. The dielectric window 103 may also be cooled when the dry air is supplied at the room temperature without heating the dry air by the heater 117 and heat is exhausted from the cooling water passing through the cooling water path 120. As a result, it is possible to heat or to cool the dielectric window 103 by tuning the heater 117 on or off.

The dry air fed to the space 128 flows upward through the cylindrical section of the waveguide 107 connected to the space 128 in the upper central section of the space 128 and is exhausted to the outside of the waveguide 107 through an exhaust port 122 disposed on an upper surface of the connecting section between the rectangular cross-sectional section and the cylindrical section of the waveguide 107. For this purpose, the dielectric plate 121 arranged in the cylindrical section of the waveguide 107 is configured to pass dry air therethrough.

To measure and to monitor temperature of the dielectric window 103, an infrared radiation temperature sensor 119 is installed on the outer side of the waveguide 107. The temperature sensor 119 transmits a signal indicating the temperature thus sensed, via a communicating device to the warm-wind heater controller 118. Based on the signal, the heater controller 118 compares the resultant temperature of the dielectric window 103 with a predetermined setting temperature. According to the comparison result, in order that the dielectric window 103 is set to a desired temperature, the heater controller 118 generates a signal to turn the heater 117 on or off to thereby adjust the operation of the heater 117. In this connection, the heater 117 adjusts the temperature of the dielectric window 103 in a range from the room temperature to 100° C.

FIG. 2 shows, in a longitudinal cross-sectional view, a magnified image of an upper section of the plasma processing apparatus according to the present embodiment shown in FIG. 1. In the configuration of FIG. 2, the infrared radiation temperature sensor 119 is installed at a position where the magnetic flux density generated by the magnetic field generating coil 110 is equal to or less than one tenth (200 Gauss) of the magnetic flux density in the coil 110.

Due to the configuration, a metallic mesh 124 to prevent leakage of the microwave is arranged on the upper surface of the member configuring the ceiling surface of the cavity resonator 108 and a viewing window 123 as a disk-shaped member to pass the infrared ray therethrough is disposed above the metallic mesh 124. In addition, a viewing hole 126 which is disposed above the viewing window 123 and which extends along an axis in the perpendicular direction to view the inside thereof by a sensor and a viewing hole 125 which is connected to an upper section of the viewing hole 126 and in which the cross-section along an axis in the perpendicular direction is reduced are arranged in the member configuring the cylindrical section of the waveguide 107. Further, above the viewing hole 125, in order that the infrared radiation temperature sensor 119 is installed at a position (with respect to the upper surface of the coil 110) where the magnetic flux density is equal to or less than one tenth of the magnetic flux density in the coil 110, there is disposed a support stage 127 mounted on the member configuring the cylindrical section of the waveguide 107.

The support stage 127 disposed above the member of the cylindrical section is tightly fixed onto the member by bolts and screws. Above the upper end section of the support stage 127, the infrared radiation temperature sensor monitor 119 is mounted to be fixed thereunto. Although not shown, in order that the infrared ray emitted from the dielectric window 103 below the viewing holes 125 and 126 and the metallic mesh 124 reaches the infrared radiation temperature sensor 119 through internal spaces of the viewing holes 125 and 126 and the metallic mesh 124, the support stage 127 is configured not to block the space for the passage of the infrared ray between the upper opening of the viewing hole 125 and the light receiving section of the infrared radiation temperature sensor monitor 119. The viewing window 123 is configured using a 3-mm thick planar member which includes calcium fluoride (barium fluoride or germanium is also available) or a material primarily including calcium fluoride (barium fluoride or germanium).

In the present embodiment, an additional viewing window 129 is arranged between the infrared radiation temperature sensor 119 and the viewing window 123. In order that fluid is supplied to the inside or the surface of the viewing window 123 to be retained in a temperature range from 20° C. to 30° C., that is, in the range of room temperature, a fluid blow-off outlet 130 is disposed. The fluid blow-off outlet 130 is connected via piping to a dry air tank and a pump as a fluid supply, not shown. Dry air in the tank is supplied via the piping to the fluid blow-off outlet 130.

As above, the support stage 127 is configured so that the viewing window 129 and the fluid blow-off outlet 130 are arranged. The viewing window 129 is configured using the same material in the same composition as for the viewing window 123. It is desired that the planar member configuring these windows are substantially equal also in thickness to each other.

Figure 3:
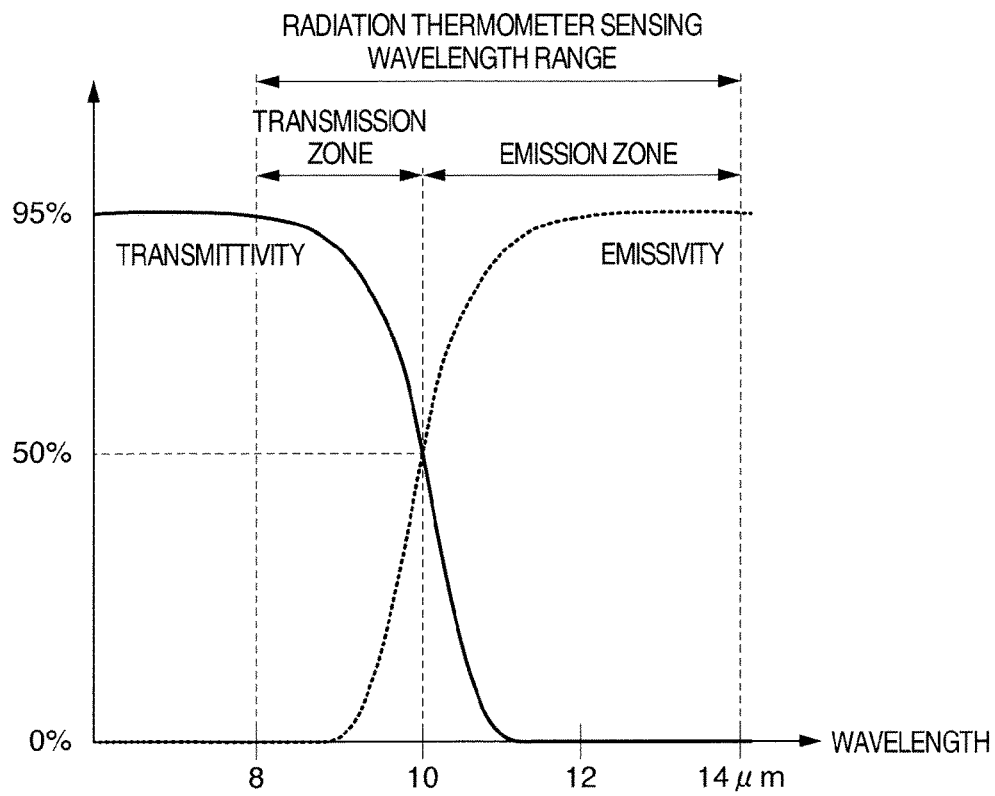
FIG. 3 is a graph showing an optical characteristic of a viewing window according to the embodiment shown in FIG. 1.

FIG. 3 is a graph showing an optical characteristic of the viewing window according to the embodiment shown in FIG. 2. Specifically, the graph demonstrates an optical characteristic of the viewing window 123 in a range of infrared wavelength from 8 μm to 14 μm when the viewing window 123 is constructed using calcium fluoride and has a thickness of 3 mm.

In the graph, the abscissa represents the infrared wavelength and the ordinate represents transmittivity and emissivity. As can be seen from the graph, the wavelength range from 8 μm to 10 μm is a zone (to be referred to as a transmission zone hereinbelow) in which the transmittivity is dominant, and the wavelength range from 10 μm to 14 μm is a zone (to be referred to as an emission zone hereinbelow) in which the emissivity is dominant.

The wavelength range from 8 μm to 14 μm is a range of wavelengths which can be sensed by the infrared radiation temperature sensor 119. In general, an infrared radiation temperature sensor to conduct observation in a temperature range from the room temperature to 500° C. includes a thermopile element. The wavelength range from 8 μm to 14 μm corresponds to the range of wavelengths which can be sensed by the thermopile element or at least includes the wavelength range for the thermopile element. As shown in the graph, the infrared ray sensed by the temperature sensor 119 including the thermopile element, specifically, the radiance thereof is, for the wavelength range from 8 μm to 10 μm, the radiance from the dielectric window 121 which passes through the viewing window 123 and is, for the wavelength range from 10 μm to 14, the radiance from the dielectric window 123.

Figure 4:
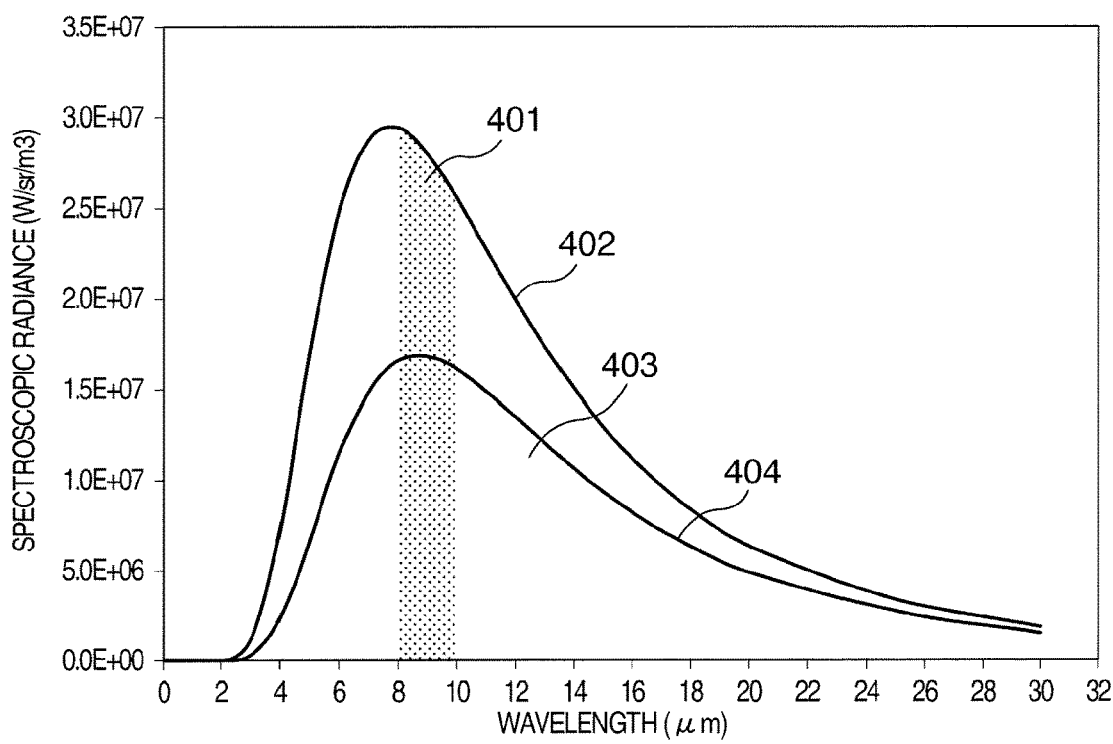
FIG. 4 is a graph showing a change in light emission intensity of infrared rays of a particular body for each wavelength.

FIG. 4 is a graph showing a change in the radiance of infrared rays of a particular body for each wavelength. In the graph, radiance (to be referred to as spectroscopic radiance herinbelow) for each wavelength is represented in the ordinate with respect to the change in the infrared wavelength represented in the abscissa for a body at 100° C. and a body at 60° C.

In the present embodiment, when the dielectric window 103 is at 100° C., the temperature of the viewing window 123 goes up to 60° C. or more. In the graph, the change in the spectroscopic radiance of the infrared ray passing through the viewing window 123 when the dielectric window 103 is at 100° C. is indicated by a solid line 402. The change in the spectroscopic radiance of the infrared ray radiated from the viewing window 123 when the dielectric window 103 is at 60° C. is indicated by a solid line 404. When the viewing window 129 disposed at a separate position thereabove is absent, an integration value 401 obtained by integrating the spectroscopic radiance of the 100° C. body for wavelength from 8 μm to 10 μm indicates the radiance of the infrared ray from the dielectric window 103 which passes through the viewing window 123 and which is detected by the temperature sensor 119. An integration value 403 obtained by integrating the spectroscopic radiance of the 60° C. body for wavelength from 10 μm to 14 μm indicates the radiance the infrared ray which is emitted from the viewing window 123 and which is detected by the temperature sensor 119.

Figure 5:
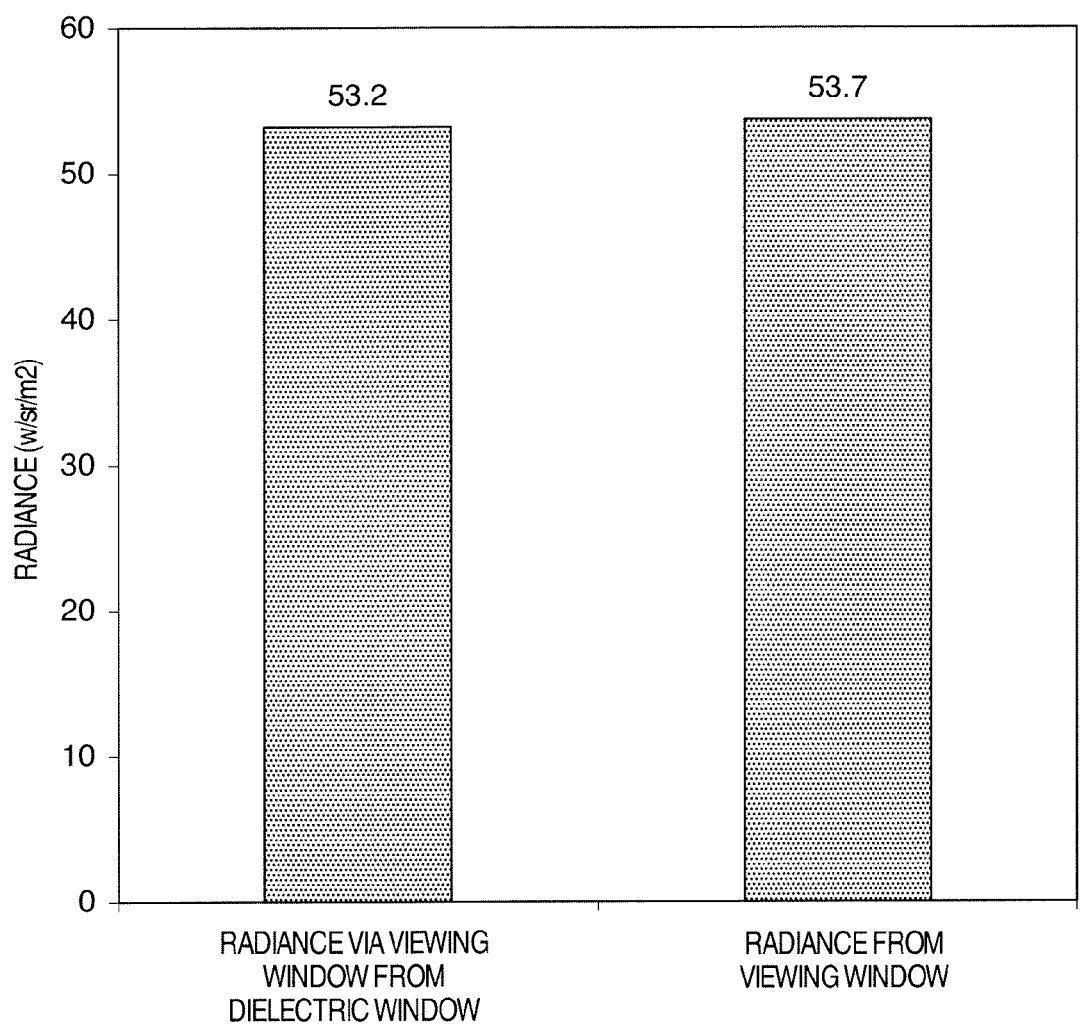
FIG. 5 is a graph showing the radiance detected by an infrared temperature sensor when there does not exist an additional viewing window according to the embodiment shown in FIG. 2.

FIG. 5 is a graph showing the radiance detected by the infrared temperature sensor 119 when there does not exist the additional viewing window according to the embodiment shown in FIG. 2. The graph shows two kinds of radiance values, i.e., the value of radiance of the infrared ray which is emitted from the dielectric window 103 and which passes through the viewing window 123 and the value of radiance of the infrared ray which is emitted from the viewing window 123 and which is sensed by the temperature sensor 119

In the present embodiment, as can be seen from the graph, the radiance of the infrared ray which is emitted from the dielectric window 103 and which passes through the viewing window 123 is similar in the value to the radiance of the infrared ray emitted from the viewing window 123 to an extent in which they are assumed to be substantially equal thereto. This indicates that 50 percent of the radiance sensed by the temperature sensor 119 is resulted from the radiation of infrared ray received from the viewing window 123. Further, when the radiance of infrared ray is detected to determine the temperature on the surface of the dielectric window 103 with the viewing window 123 interposed as above, the magnitude and precision of the value are considerably influenced by the viewing window 123.

Figure 6:
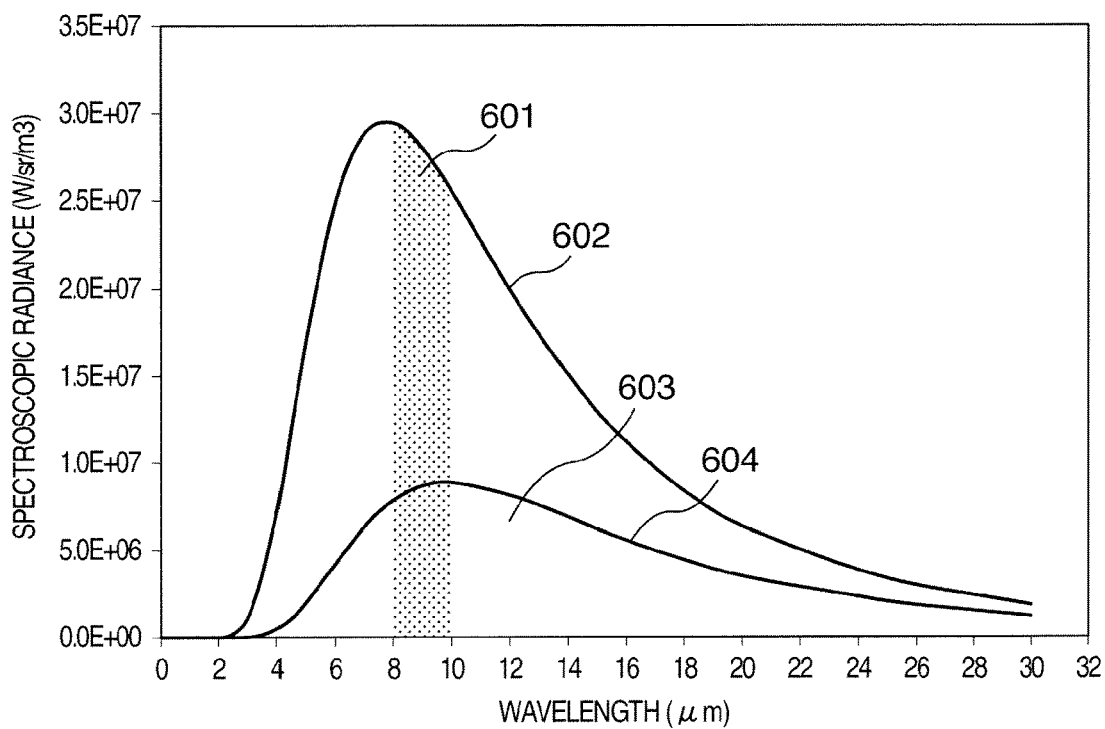
FIG. 6 is a graph showing an optical characteristic of the additional viewing window according to the embodiment shown in FIG. 2.

FIG. 6 is a graph showing an optical characteristic of an additional viewing window according to the embodiment shown in FIG. 2. In the graph, the spectroscopic radiance is represented along the ordinate when a particular body, a blackbody in this example, is at 100° C. and 60° C.

Assume that the viewing window 129 is disposed in the configuration. Since the viewing window 129 is disposed apart from the viewing window 123 thereabove, the value of heat imparted from the viewing window 123 or via the support stage 127 is quite small to be regarded as zero or as substantially zero. It is hence possible to assume that there exists no heat source to heat the viewing window 123.

In the present embodiment, the viewing window 129 is in contact with the dry air supplied as above in a clean room the temperature of which is appropriately adjusted in a building in which the plasma processing apparatus is installed, and is set to the room temperature, specifically, 20° C. In the graph, the change in the spectroscopic radiance of the infrared ray passing through the viewing window 123 when the dielectric window 103 is at 100° C. is indicated by a solid line 602. The change in the spectroscopic radiance of the infrared ray radiated from the viewing window 129 when the viewing window 129 is at 20° C. is indicated by a solid line 604. In this graph as in the graph shown in FIG. 4, an integration value 601 obtained by integrating, for a wavelength range from 8 μm to 10 μm, the value of the spectroscopic radiance, indicated by the solid line 602 in this graph, of the infrared ray which passes through the viewing window 129 when the dielectric window 103 is at 100° C. indicates the radiance of the infrared ray from the dielectric window 103 which passes through the viewing window 129 and which is detected by the temperature sensor 119. An integration value 603 obtained by integrating, for a wavelength range from 10 μm to 14 μm, the spectroscopic radiance of the infrared ray emitted from the 20° C. viewing window 129 indicates the radiance of the infrared ray which is emitted from the viewing window 129 and which is detected by the temperature sensor 119.

Figure 7:
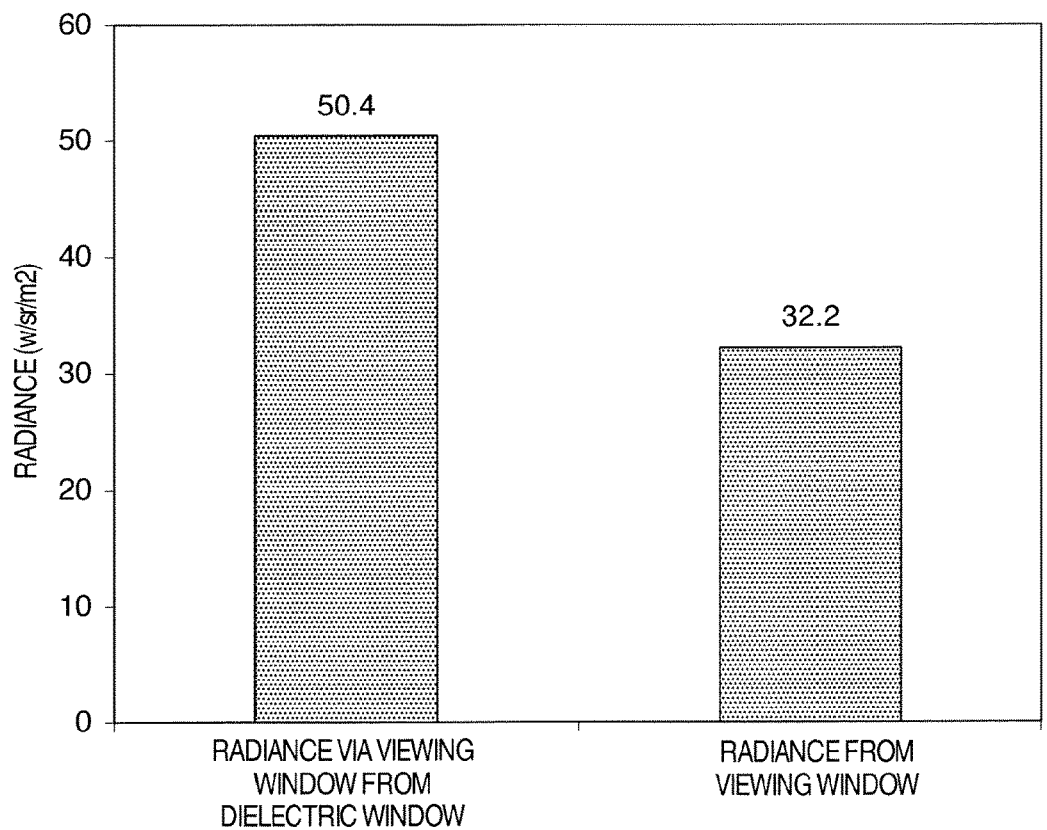
FIG. 7 is a graph showing the radiance detected by an infrared temperature sensor 191 when the additional viewing window according to the embodiment shown in FIG. 2 is disposed.

FIG. 7 shows the radiance of the infrared ray detected by the infrared temperature sensor 119 when an additional viewing window is present. Specifically, FIG. 7 is a graph showing the radiance detected by the temperature sensor 191 when the additional viewing window according to the embodiment shown in FIG. 2 is disposed.

The graph of FIG. 7 shows two kinds of radiance values, that is, the value of radiance of the infrared ray which is emitted from the dielectric window 103 and which passes through the viewing window 129 and the value of radiance of the infrared ray which is emitted from the viewing window 129 and which is sensed by the temperature sensor 119. The value of radiance of the infrared ray emitted from the viewing window 129 is about 60 percent of the value of radiance of the infrared ray which is emitted from the dielectric window 103 and which passes through the viewing window 129. This indicates that the influence from the viewing window 129 is less than that from the viewing window 123.

Figure 8:
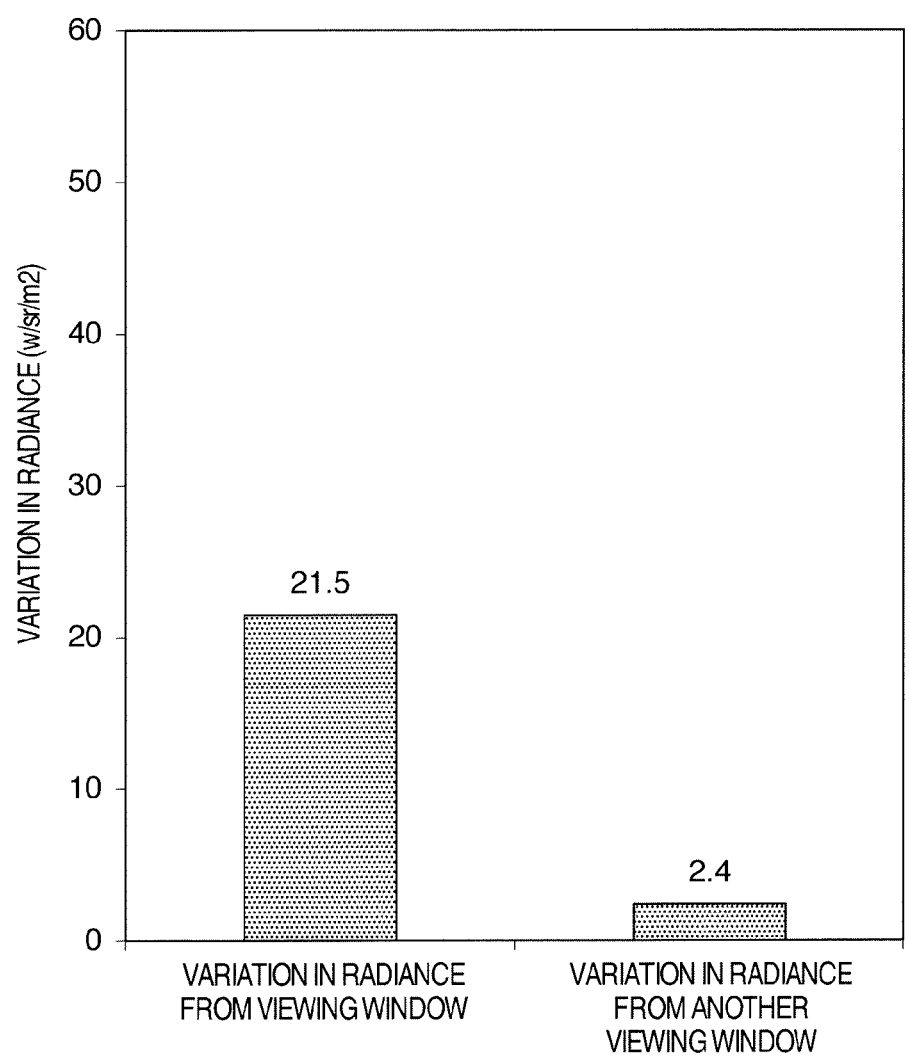
FIG. 8 is a graph showing magnitude of a change in the radiance with respect to a change in temperature of viewing windows 123 and 129 according to the embodiment shown in FIG. 2.

FIG. 8 is a graph showing magnitude of a change of the radiance with respect to a change of temperature of viewing windows 123 and 129 according to the embodiment shown in FIG. 2. As can be seen from the graph, the quantity of change in the radiance of viewing window 129 is about one tenth that of change in the radiance of the viewing window 123. This is because when the dielectric window 103 is heated from 20° C. up to 100° C., the viewing window 123 changes in temperature from 20° C. to 60° C., but the viewing window 129 changes in a temperature range from 20° C. to 30° C. in a more stable state.

On the other hand, when the viewing window 129 of the present embodiment is disposed, the influence upon the precision in the sensing operation of the temperature sensor 119 from the member of the viewing window 129 can be reduced as compared with when only the viewing window 123 is disposed. Also, when the temperature of the viewing window 129 is stabilized, the change in the radiance from the viewing window 129 is lowered. Hence, it is possible to further increase the sensing precision. That is, when the variation in the temperature of the viewing window 129 or the variation in the radiance due to the variation in the temperature is fully small or is substantially negligible in magnitude when compared with the variation in the radiance from the dielectric window 103, it is possible to correct the output and the detected value and data from the temperature sensor 119 by use of the temperature from the viewing window 129 or the value of the radiance obtained using the temperature.

Figure 9:
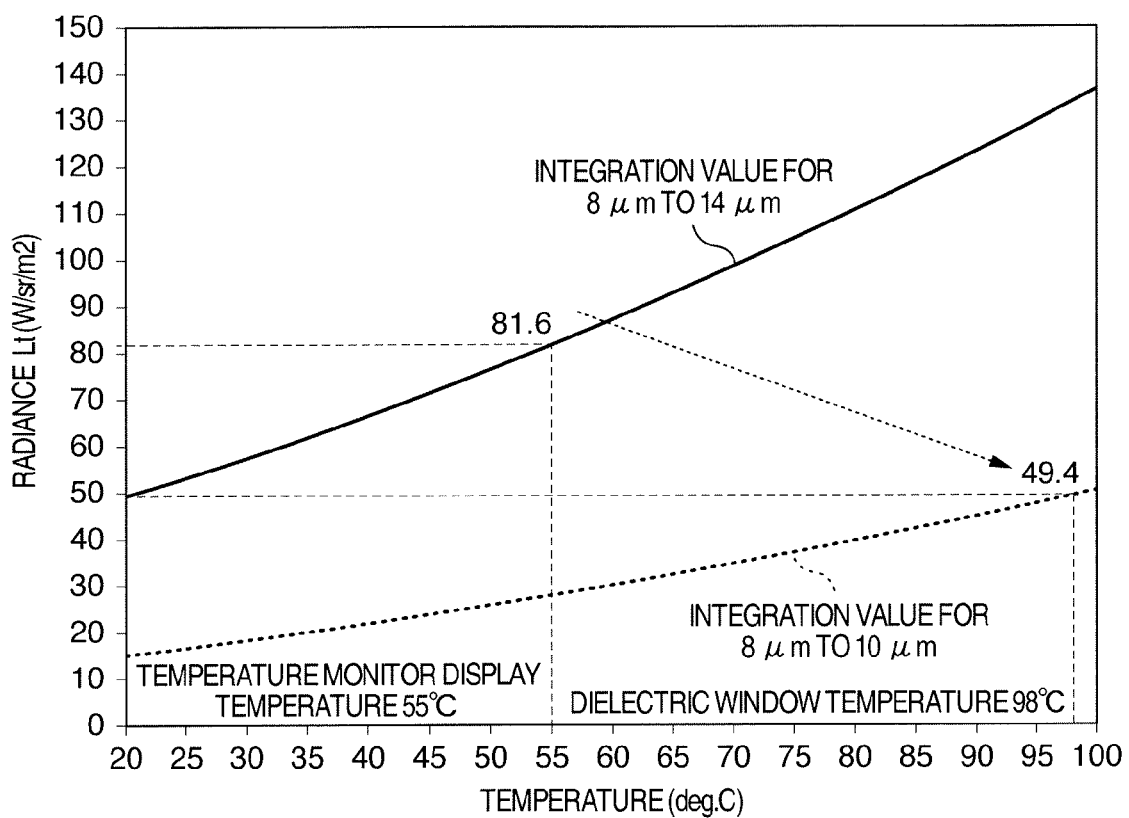
FIG. 9 is a graph showing a method of correcting, by use of the radiance of the viewing windows, the output or the detection value of the infrared temperature sensor according to the embodiment shown in FIG. 2.

FIG. 9 is a graph showing a method of correcting, by use of the radiance of the viewing window, the output or the detection value of the infrared temperature sensor 119 according to the embodiment shown in FIG. 2. In this example, for the correction of the detection value, there are employed the radiance value in a range of the infrared wavelength from 8 μm to 14 μm for the temperature ranging from 20° C. to 100° C. of the viewing window 129 and the radiance value in a range of the infrared wavelength from 8 μm to 10 μm for the temperature ranging from 20° C. to 100° C. of the viewing window 129, specifically, the integration values obtained by integrating the spectroscopic radiance values respectively in these wavelength ranges.

These values are beforehand recorded or stored as data of conversion values, in the warm-wind heater controller 118 or in a storage such as a memory or a hard disk which are externally installed and which are communicably connected to the heater controller 118 Assume that at reception of infrared rays via the viewing windows 123 and 129, the infrared temperature sensor 119 resultantly indicates 55° C. as the detection value of temperature. For the radiance from the viewing window 129 in a predetermined temperature range, the arithmetic unit such as a CPU device or the like in the heater controller 118 refers to data in the storage to obtain 32.2 W/sr/m$^2$ as the radiance as shown in FIG. 7. Hence, by subtracting the radiance 32.2 W/sr/m$^2$ of the viewing window 129 from the radiance 81.6 W/sr/m$^2$ described above, to thereby detect or calculate the radiance of the infrared ray received through the viewing window 129 as 49.4 W/sr/m$^2$.

For 49.4 W/sr/m$^2$, the arithmetic unit calculates the temperature corresponding to the integration value of the radiance in the wavelength range from 8 μm to 14 μm based on the beforehand stored data, to obtain the temperature as 98° C. As a result, the heater controller 118 detects that the temperature of dielectric window 103 is 98° C. As above, by correcting the detection value of the infrared temperature sensor 119, the influence from the viewing window 129 is reduced, to detect the temperature with high precision. In addition, based on the temperature detection with high precision, it is possible that the temperature of the inner walls of the processing chamber of the plasma processing apparatus is appropriately adjusted, to appropriately conduct processing in the plasma processing apparatus. As a result, it is possible to obtain a desired contour of wiring structure on the upper surface of the wafer.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A plasma processing apparatus, comprising:
a processing chamber disposed in a vacuum container;
gas supply means for supplying gas to the processing chamber;
a sample stage which is disposed in the processing chamber and on which a sample to be processed is mounted;
a planar member comprising a dielectric material which is disposed above the processing chamber to cover the processing chamber and through which an electric field supplied to form plasma in the processing chamber passes;
an electric field supply path disposed outside the processing chamber for supplying the electric field to the planar member;
a magnetic field generating coil disposed outside the processing chamber;
an infrared sensor disposed on an upper end of a support stage outside the planar member apart therefrom for receiving an infrared ray emitted from the planar member and for thereby detecting temperature of the planar member;

a first window member disposed between the planar member and the infrared sensor; and
a second window member disposed between the planar member and the infrared sensor to be spaced apart from the first window member,
the first and second window members comprising one and the same material, wherein:
temperature of the second window member is in a predetermined range; and
at reception of the infrared ray having passed through the first and second window members, the infrared sensor detects the temperature of the planar member,
wherein the support stage is constructed such that said infrared sensor is disposed on said support stage at a position located a distance from an upper surface of the magnetic field generating coil such that a magnetic flux density at said infrared sensor generated by the magnetic field generating coil is equal to or less than one-tenth of a magnetic flux density in the magnetic field generating coil.

2. The plasma processing apparatus according to claim 1, wherein
the temperature of the planar member is detected by correcting an output obtained from the infrared sensor according to the temperature of the second window member.

3. The plasma processing apparatus according to claim 2, wherein
the temperature of the planar member is adjusted according to a condition of processing on the sample.

4. The plasma processing apparatus according to claim 1, wherein
the temperature of the planar member is adjusted according to a condition of processing on the sample.

5. The plasma processing apparatus according to claim 1, wherein said first and second window members are both constructed using a material including calcium fluoride.

6. The plasma processing apparatus according to claim 5, wherein said first and second window members both have a thickness of 3 mm.

* * * * *